United States Patent
Raju et al.

(10) Patent No.: US 9,281,884 B2
(45) Date of Patent: *Mar. 8, 2016

(54) REORDERING OF A BEAMFORMING MATRIX

(71) Applicant: Imagination Technologies, Limited, Kings Langley (GB)

(72) Inventors: Meesaraganda Surendra Raju, Bangalore (IN); Sujai Chari, Burlingame, CA (US)

(73) Assignee: Imagination Technologies, LLC (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/476,522

(22) Filed: Sep. 3, 2014

(65) Prior Publication Data

US 2015/0288436 A1 Oct. 8, 2015

Related U.S. Application Data

(60) Provisional application No. 61/976,070, filed on Apr. 7, 2014.

(51) Int. Cl.
*H04B 1/38* (2015.01)
*H04L 5/16* (2006.01)
*H04B 7/04* (2006.01)
(Continued)

(52) U.S. Cl.
CPC ............ *H04B 7/0486* (2013.01); *H04B 7/0456* (2013.01); *H04B 7/0617* (2013.01); *H04B 7/0634* (2013.01); *H04L 1/0071* (2013.01); *H04L 1/0045* (2013.01); *H04L 1/0057* (2013.01); *H04L 1/0059* (2013.01)

(58) Field of Classification Search
CPC .. H04B 7/0486; H04B 7/0617; H04L 1/0071; H04L 1/0059
USPC ......................................................... 375/219
See application file for complete search history.

(56) References Cited

U.S. PATENT DOCUMENTS

| | | | |
|---|---|---|---|
| 6,697,633 B1 * | 2/2004 | Dogan | G01S 3/74 455/450 |
| 2007/0201575 A1 | 8/2007 | Ariyavisitakul et al. | |

(Continued)

FOREIGN PATENT DOCUMENTS

GB 2434946 8/2007

OTHER PUBLICATIONS

GB1504416.7; Combined Search and Examination Report under Sections 17 and 18(3).

(Continued)

*Primary Examiner* — Nader Bolourchi
(74) *Attorney, Agent, or Firm* — Brian R. Short

(57) ABSTRACT

Apparatuses, methods and systems for beamforming are disclosed. One embodiment of a method includes generating a beamforming matrix, including obtaining a channel matrix of a multiple-input, multiple-output (MIMO) between a multiple antenna transmitter and a receiver, determining an initial beamforming matrix based on a singular value decomposition of the channel matrix, generating a final beamforming matrix comprising re-ordering columns of the initial beamforming matrix for at least one sub-carrier of a multi-carrier signal based on a signal characteristic, processing a plurality of multi-carrier signals using the final beamforming matrix, and transmitting the processed plurality of multi-carrier signals through a plurality of transmit chains.

31 Claims, 13 Drawing Sheets

(51) Int. Cl.
*H04B 7/06* (2006.01)
*H04L 1/00* (2006.01)

(56) References Cited

U.S. PATENT DOCUMENTS

| | | |
|---|---|---|
| 2008/0043873 A1 | 2/2008 | Ariyavisitakul |
| 2008/0080634 A1 | 4/2008 | Kotecha |
| 2008/0304463 A1* | 12/2008 | Borkar ............... H04B 7/0417 370/342 |
| 2008/0304464 A1 | 12/2008 | Borkar |
| 2009/0102715 A1 | 4/2009 | Lou |
| 2009/0221241 A1* | 9/2009 | Ghosh ................. H01Q 3/26 455/69 |
| 2009/0304103 A1 | 12/2009 | Vaidyanathan |
| 2010/0150260 A1 | 6/2010 | Ariyavisitakul et al. |
| 2010/0226456 A1 | 9/2010 | Ariyavisitakul |
| 2011/0080972 A1 | 4/2011 | Xi |
| 2012/0045003 A1* | 2/2012 | Li ........................ H04B 7/0641 375/260 |
| 2013/0044683 A1* | 2/2013 | Maltsev .............. H04B 7/0404 370/328 |
| 2013/0077514 A1 | 3/2013 | Dinan |
| 2014/0056334 A1 | 2/2014 | Khina et al. |
| 2014/0153662 A1* | 6/2014 | Lin ..................... H04B 7/0617 375/267 |

OTHER PUBLICATIONS

GB1504417.7; Combined Search and Examination Report under Sections 17 and 18(3).
Ismail, M.R., "Exploiting Irregular Variable Node Degree in a MIMO System", IEEE ICCS 2006, pp. 1-5, Singapore, Oct. 2006.

* cited by examiner

US 9,281,884 B2

REORDERING OF A BEAMFORMING MATRIX

RELATED APPLICATIONS

This patent application claims the benefit of U.S. Provisional Patent Application Ser. No. 61/976,070 filed Apr. 7, 2014, which is herein incorporated by reference.

FIELD OF THE DESCRIBED EMBODIMENTS

The described embodiments relate generally to wireless communications. More particularly, the described embodiments relate to systems, methods and apparatuses for reordering a beamforming matrix.

BACKGROUND

Transmit beamforming techniques have been used in many variations in multiple-input, multiple-output (MIMO) systems. Typically, these techniques include the computation of a beamforming matrix at a receiver based on a measurement of the transmission (MIMO) channel. When the matrix is communicated to the transmitter and applied by the transmitter on subsequent traffic, the effective received signal-to-noise ratio (SNR) for each stream in the MIMO system is improved resulting in improved overall performance. While these solutions offer performance improvement by improving the effective SNR at the receiver, the interaction between the distributions of SNRs across multiple antenna chains and subcarriers, for different decoding and de-interleaving processes, and for data stream parsing and de-parsing are not considered. These interactions can lead to substantially degraded performance compared to theoretically expected results.

It is desirable to have methods apparatuses, and systems for generating beamformed signals that account for the interactions between the distributions of SNRs across multiple antenna chains and subcarriers, for different decoding and de-interleaving processes, and for data stream parsing and de-parsing.

SUMMARY

An embodiment includes a method of beamforming. The method includes generating a beamforming matrix, including obtaining a channel matrix of a multiple-input, multiple-output (MIMO) between a multiple antenna transmitter and a receiver, determining an initial beamforming matrix based on a singular value decomposition of the channel matrix, and generating a final beamforming matrix, wherein generating the final beamforming matrix includes re-ordering columns of the initial beamforming matrix for at least one sub-carrier of a multi-carrier signal based on a signal characteristic.

At least some embodiments further include processing a plurality of multi-carrier signals using the final beamforming matrix, and transmitting the processed plurality of multi-carrier signals through a plurality of transmitter chains.

Another embodiment includes an apparatus. The apparatus includes a plurality of receive chains, and a processor. The processor is operative to obtain a channel matrix of a multiple-input, multiple-output (MIMO) channel between a multiple antenna transmitter and the plurality of receive chains, determine an initial beamforming matrix based on a singular value decomposition of the channel matrix, and generate a final beamforming matrix, wherein generating the final beamforming matrix includes re-ordering columns of the initial beamforming matrix for a selected beamforming technique for at least one sub-carrier of a multi-carrier signal based on a signal characteristic.

For at least some embodiments, the transceiver includes the multiple antenna transmitter, and the processor is further operative to facilitate processing of a plurality of multi-carrier signals using the final beamforming matrix, and the transceiver is operative to transmit the processed plurality of multi-carrier signals through a plurality of transmit chains.

For at least some embodiments, the transceiver is further operative to transmit the final beamforming matrix through a transmit chain back to a second transceiver that includes the multiple antenna transmitter.

Other aspects and advantages of the described embodiments will become apparent from the following detailed description, taken in conjunction with the accompanying drawings, illustrating by way of example the principles of the described embodiments.

DETAILED DESCRIPTION

The embodiments described include methods, apparatuses, and systems for reducing the implementation loss (that is, performance loss relative to a theoretical limit) of beamforming resulting from the interaction between the signal-to-noise-ratios (SNRs) across multiple antenna chains and subcarriers, the decoding and de-interleaving, and/or stream parsing and de-parsing processes of multi-carrier, multiple-input, multiple-output (MIMO) communications. At least some embodiments include dynamically adjusting computation of a beamforming matrix based on the specific interplay between a measured MIMO channel, the de-interleaving and decoding, stream parsing and/or de-parsing processes resulting in better performance (that is, lower Packet Error Rate) than traditional MIMO beamforming techniques.

At least some embodiments include determining a final beamforming matrix by a processor of a transceiver re-ordering columns of an initial transmit matrix. For one embodiment, the transceiver transmits the final beamforming matrix back to second transceiver that applies the final transmit matrix to multiple spatial transmit streams. For another embodiment, the transceiver applies the final transmit matrix to multiple spatial transmit streams of the transceiver.

Figure 1:
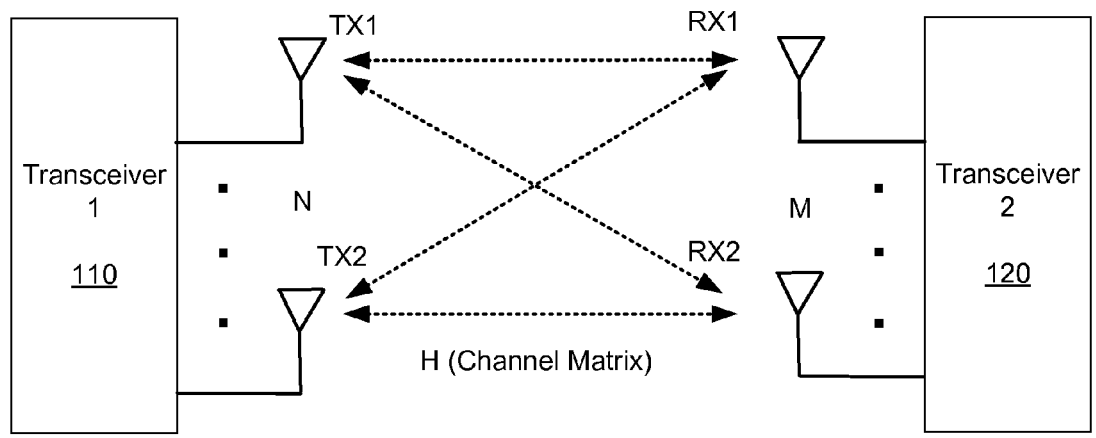
FIG. 1 shows a first transceiver, a second transceiver, and a MIMO transmission channel between the transceivers, according to an embodiment.

FIG. 1 shows a first transceiver 110, a second transceiver 120, and a MIMO transmission channel between the transceivers 110, 120, according to an embodiment. As shown, the first transceiver 110 includes N antennas transmitting communication signals, and the second transceiver 120 includes M antennas receiving communications signals. Accordingly, the transmission channel between the first transceiver 110 and the second transceiver 120 can be characterized by an M×N channel matrix H.

For an embodiment, the transmission signals between the first transceiver 110 and the second transceiver 120 include multi-carrier modulation signals. Multi-carrier modulation (MCM) is a method of transmitting data by splitting it into several components, and sending each of these components over separate carrier signals. The individual carriers have narrow bandwidth, but the composite signal can have broad bandwidth. The advantages of MCM include relative immunity to fading caused by transmission over more than one path at a time (multipath fading), less susceptibility than single-carrier systems to interference caused by impulse noise, and enhanced immunity to inter-symbol interference.

An exemplary form of MCM includes orthogonal frequency-division multiplexing (OFDM). OFDM is essentially identical to coded OFDM (COFDM) and discrete multi-tone modulation (DMT), and is a frequency-division multiplexing (FDM) scheme used as a digital multi-carrier modulation method. The primary advantage of OFDM over single-carrier schemes is its ability to cope with severe channel conditions (for example, narrowband interference and frequency-selective fading due to multipath) without complex equalization filters. Channel equalization is simplified because OFDM may be viewed as using many slowly modulated narrowband signals rather than one rapidly modulated wideband signal. The low symbol rate makes the use of a guard interval between symbols affordable, making it possible to eliminate intersymbol interference (ISI) and utilize echoes and time-spreading to achieve a diversity gain, that is, a signal-to-noise ratio improvement.

An embodiment includes obtaining a channel matrix H per sub-carrier of a multi-carrier signal. For an embodiment, the channel matrix is determined at the receiver, and communicated back to the transmitter. However, for another embodiment, the channel matrix is determined at the transmitter. That is, by assuming reciprocity of the transmission channel, signals received by the transmitting transceiver from the receiving transmitter can be used to determine the channel matrix H.

An embodiment includes performing a SVD (singular value decomposition) matrix decomposition $H=USV^H$ for each subcarrier. That is, the SVD decomposition is based on the previously described channel matrix H. For an embodiment of the SVD matrix decomposition:
U is a left singular vector matrix;
S is a singular value matrix; and
V is a right singular vector matrix (for an embodiment, this is the beamforming matrix applied at the transmitter).

It is to be noted, that for at least some of the described embodiments, S is diagonal matrix with each of the diagonal values corresponding to a singular value. Further, there are many possible methods to realize the decomposition. Depending on the technique, different ordering of singular values (that is, the diagonal elements of the S matrix) can result. For an embodiment, the diagonal elements increase in magnitude traversing down the diagonal of the S matrix. For another embodiment, the diagonal elements decrease in magnitude traversing down the diagonal of the S matrix. Without loss of generality, at least some of the described embodiments assume that the diagonal elements of S are in decreasing order traversing down the diagonal.

For at least some embodiments, the right singular vector matrix, V, is used as an initial beamforming matrix. If this matrix is applied at the transmitter, then the effective channel seen at the receiver is $H*V=USV^H V=US$. The received signal at a particular subcarrier can be denoted as $Y=HVX+N$, where VX is the beam-formed transmitted data and N is the additive noise. Since U is orthonormal, after pre-multiplication of Y by $U^H$ at the receiver, the effective received vector can written as $Y_{eff}=U^H Y=SX+U^H N$. Thus, since S is diagonal, each of the multiple transmitted streams can be detected independently. Additionally, the signal quality or SNR on each stream is determined by the corresponding singular value. For instance, if there are two transmitted streams in a 2×2 system, a first transmitted stream's SNR is based on the first singular value of S (that is, $S(1,1)$) and a second transmitted stream's SNR is based on the second singular value of S (that is, $S(2,2)$). If the streams are decoded completely independently, the link performance is dictated by the stream with the worse SNR. Since the channel can be different for each subcarrier in an OFDM system, if the higher of the two SNRs resulting from the singular values of the S matrix for each subcarrier can be distributed between the streams evenly, then the resulting discrepancy in average SNR across both streams could be reduced, thereby improving the error of the worst stream and hence improving overall link performance.

Even for the case where the streams are jointly decoded, judiciously distributing the higher/highest SNRs among the streams across the subcarriers can improve the overall link performance.

Reordering the columns of the initial beamforming matrix is one method of generating a final beamforming matrix which can be used to multiply the transmit data and thereby improve link performance compared to using the initial beamforming matrix to multiply the transmit data.

Figure 2:
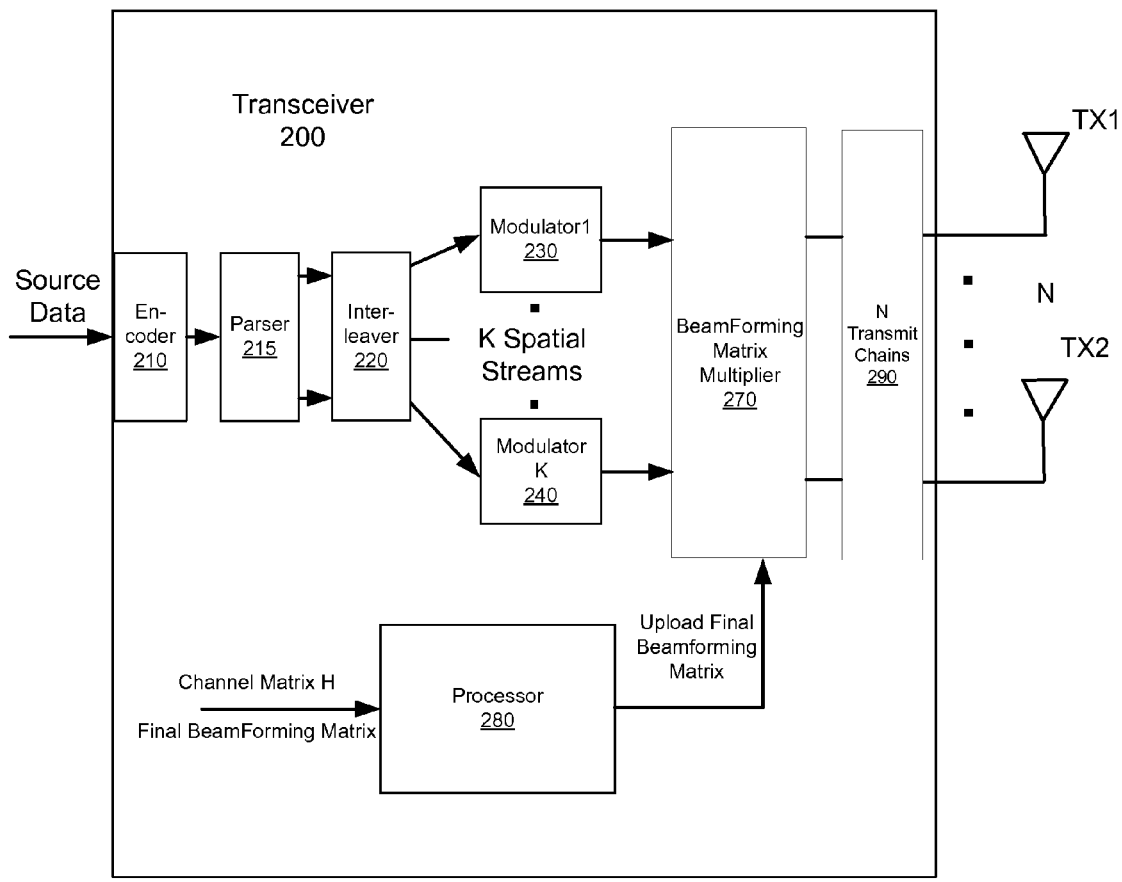
FIG. 2 shows a transmitter of a transceiver that includes K spatial streams, N transmit antennas, and beamforming processing, according to an embodiment.

FIG. 2 shows a transmitter of a transceiver that includes K spatial streams, N transmit antennas, and beamforming processing, according to an embodiment. As shown, a stream of data (source data) is received by the transmitter portion, which is encoded by an encoder 210, parsed into multiple (K) spatial data streams by a parser 215, and interleaved by an inter-leaver 220. The plurality of K spatial streams includes N modulators 230, 240. Multiplication of the K spatial streams by a beamforming matrix, 270, results in the data which is transmitted by N transmit chains 290 from the N multiple transmit antennas TX1, TX2 . . . TXN.

For an embodiment, the final beamforming matrix is determined elsewhere (for example, at a receiver of the K spatial streams) and then communicated to the transmitter. Based on the channel matrix H and the final beamforming matrix, a processor 280 of the transceiver 200 uploads the coefficients of the final beamforming matrix to a beamforming matrix multiplier 270. For another embodiment, the final beamforming matrix is generated at the transmitter if the previously describe reciprocity of the transmission channel is assumed. It is to be understood that while the beamforming matrix multiplier is 270 depicted as a separate functional block, for at least some embodiments that processing provided by the beamforming matrix multiplier is 270 is incorporated into the processing of the processor 280. For at least some embodiments, the processor 280 facilitates the processing For at least some embodiments, generating the final beamforming matrix includes obtaining the channel matrix (H) of a multiple-input, multiple-output (MIMO) channel between a multiple antenna transmitter and a receiver, determining an initial beamforming matrix based on a singular value decomposition of the channel matrix. Finally, the final beamforming matrix is generated by re-ordering columns of the initial beamforming matrix for at least one sub-carrier of a multi-carrier signal based on a signal characteristic.

Once the final beamforming matrix has been generated, a plurality of multi-carrier signals are processed using the final beamforming matrix (that is, for example, through the beamforming matrix multiplier 270), and the processed plurality of multi-carrier signals are transmitted through a plurality of transmit chains of the multiple antenna transmitter.

Re-Ordering of Columns of the Initial Beamforming Matrix

For an embodiment, one or more of various signal characteristics can be used for determining how to re-order columns of the initial beamforming matrix. For an embodiment, the re-ordering of the columns is dependent on the modulation and coding schemes used for transmission. For at least some embodiments, the re-ordering of the columns is performed on a sub-carrier basis of the multi-carrier transmission signal.

Figure 3:
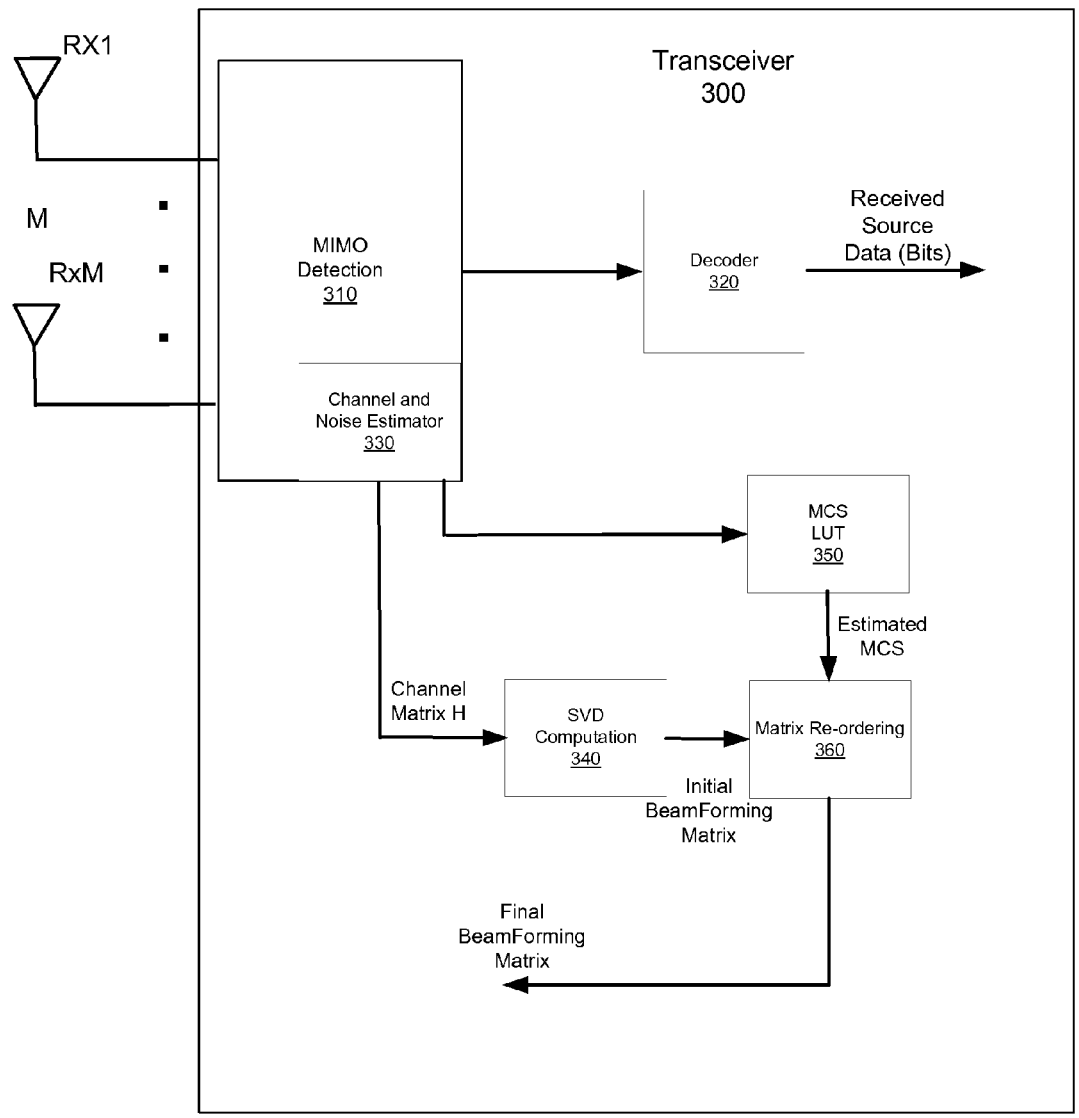
FIG. 3 shows a receiver portion of a transceiver that includes M receiver antennas, and beamforming matrix processing, according to an embodiment.

FIG. 3 shows a receiver portion of a transceiver 300 that includes M receive antennas, and beamforming matrix processing, according to an embodiment. For this embodiment, the receiver portion of a receiving transceiver performs the processing and determination of the final beamforming matrix. As shown, the receiver includes M receive antennas that receive the K spatial streams transmitted by the transmitting transceiver.

A MIMO detector 310 processes the received signals, and generates a received bit stream. A decoder 320 decodes the received bit stream, ideally yielding the K spatially separate streams of bits. Processing the received signals, includes estimation of the channel and noise (330) which is subsequently used to equalize and decode the signal resulting in the decoded bit stream.

The channel and noise estimator 330 also performs a channel quality estimation, which can be used to determine the modulation and coding schemes used for transmission. For an embodiment, a look up table (LUT) 350 is accessed that provides a modulation and coding scheme for a determined channel quality. For an embodiment, the channel and noise estimator 330 generates the channel matrix H.

An SVD decomposition block 340 performs the previously described SVD decomposition, yielding an initial beamforming matrix.

Once the modulation and coding schemes having been determined, an embodiment includes re-ordering the columns (360) of the initial beamforming matrix based on the modulation and coding scheme.

As described, for embodiments, the initial Singular Value matrix S is re-ordered to S' based on various metrics. For an embodiment, this includes computing a new beamforming matrix V' based on S'. Note that V' is obtained by shuffling the columns of V. So, in practice, S' does not have to be computed/determined. If the desired reordering is known, V' can be obtained from V by shuffling the columns corresponding to the desired reordering. Although the discussion regarding reordering below is described in terms of reordering singular values of the S matrix, the discussion equivalently applies to reordering columns of V as well. One advantage of doing the permutation on V is that the transmitter (which has more direct knowledge of MCS, coding, etc.) can choose permutation based on those parameters.

For an embodiment, the column re-ordering of the initial beamforming matrix is based on the modulation and coding scheme being used on a transmission packet. If there is a set of known MCS a priori, a lookup table (MCS LUT 350) can be used based on MCS for the current packet, to determine the reordering scheme for the next packet, or a set of next packets.

The described embodiments include different possible reordering schemes for multi-carrier modulation. For an embodiment, selecting a beamforming technique includes singular value decomposition (SVD), wherein an initial beamforming matrix includes at least one of Ascending Value SVD (AVSVD) that includes diagonal singular values in an increasing order, or Descending Value SVD (DVSVD) that includes diagonal singular values in a decreasing order. Further, for an embodiment, if the initial beamforming matrix includes AVSVD, then the final beamforming matrix includes DVSVD, and if the initial beamforming matrix includes DVSVD, then the final beamforming matrix includes AVSVD. That is, for at least some embodiments, all of the sub-carriers of the multi-carrier signals use the conventional SVD (DVSVD) to determine the initial beamforming matrix. That is, singular values in decreasing order.

At least some embodiments include identifying a number of possible permutations of the re-ordering of columns to be a number N, dividing the total number of subcarriers into N sets, and re-ordering columns of the initial beamforming matrix according to a one of the N permutations for at least a subset of the N sets. There are several examples of how this embodiment may be realized. For at least some embodiments, alternating sub-carriers use different reordering such that sub-carriers with even indexing have singular values in decreasing order while sub-carriers with odd indexing have singular values in increasing order. For at least some embodiments, a first half of the sub-carriers use the conventional SVD, that is, have singular values in decreasing order while remaining half use modified SVD, that is, have singular values in increasing order. For at least some embodiments, a first half of the sub-carriers use the modified SVD, that is, have singular values in increasing order while remaining half use conventional SVD, that is, have singular values in decreasing order. Although above examples describe reordering using N=2 permutations (increasing order, decreasing order), possible reordering schemes can be extended to larger values of N.

For at least some embodiments, the performance of different MCS (modulation and coding schemes) formats can be analyzed with different re-ordering schemes, such that an optimal reordering scheme exists for each MCS format. This analysis can be used to develop look up tables for further processing.

For example, in the 802.11n/ac system, for the 20 MHz bandwidth case with 2 spatial streams where convolutional coding is used, MCS schemes 0, 1, 2, 3, 4, 6 and 8 (per the IEEE 802.11ac standard) perform better when simulated across a large set of dispersive channels when the singular values are ordered in decreasing order, while in MCS schemes 5 and 7, an improved performance is observed when the singular values are ordered in increasing order. The table below summarizes the modulation and coding rate used for the aforementioned MCS schemes and the preferred reordering scheme. The MCS and associated transmission signal characteristics are based on the IEEE 802.11ac standard, as depicted in the following table.

| MCS | Modulation | Coding Rate | Preferred singular value ordering |
|---|---|---|---|
| 0 | BPSK | ½ | Decreasing |
| 1 | QPSK | ½ | Decreasing |
| 2 | QPSK | ¾ | Decreasing |
| 3 | 16-QAM | ½ | Decreasing |
| 4 | 16-QAM | ¾ | Decreasing |
| 5 | 64-QAM | ⅔ | Increasing |
| 6 | 64-QAM | ¾ | Decreasing |
| 7 | 64-QAM | ⅚ | Increasing |
| 8 | 256-QAM | ¾ | Decreasing |

Although each MCS is designated above using modulation and coding rate, there are other elements of the transmission signal such as the interleaver, mapper, puncturer, parser which all play a role in determining which reordering scheme will improve the performance. The above table chooses among a set of N=2 reordering schemes. However, the performance comparison can be extended to a larger set of reordering schemes.

Figure 4:
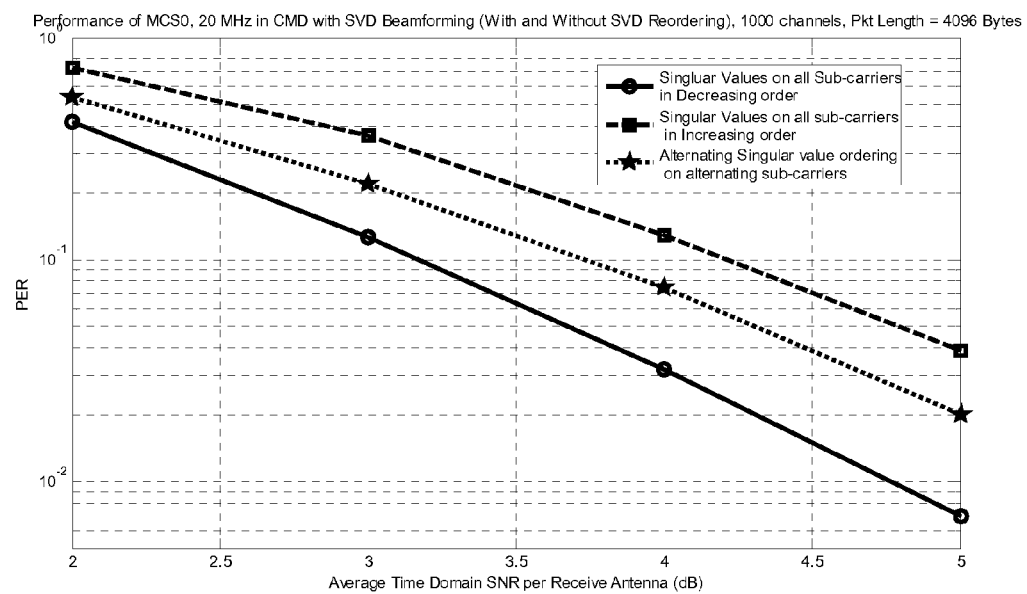
FIG. 4 shows the performance of MCS0 with different singular value re-ordering schemes in CMD (channel model D provided by IEEE for modeling Wireless LAN propagation environment) channels, according to an embodiment.
Figure 5:
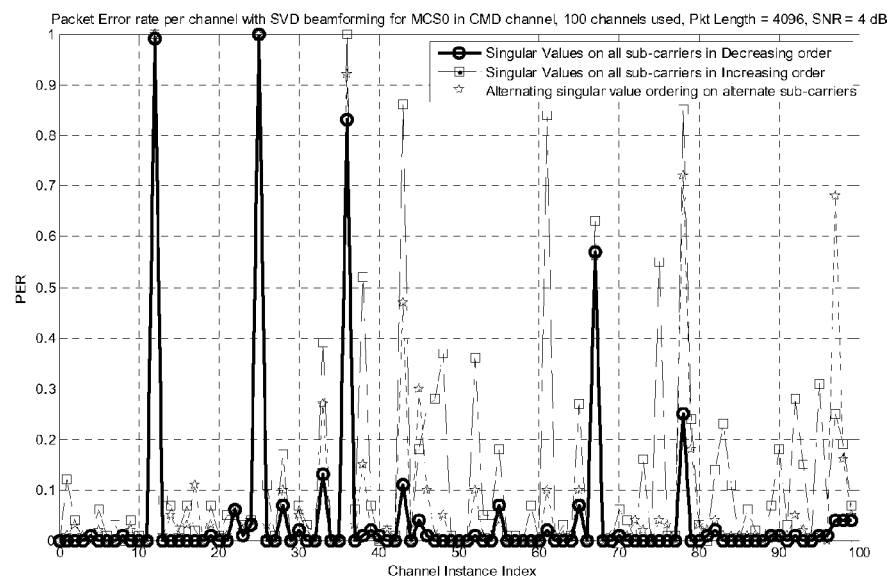
FIG. 5 shows packet errors statistics of MCS0 across 100 CMD channels with different re-ordering schemes, according to an embodiment.
Figure 6:
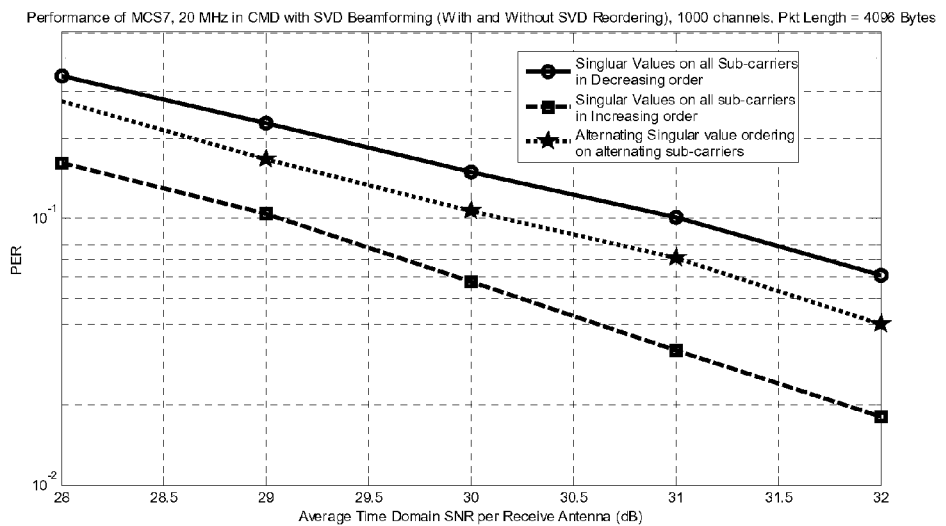
FIG. 6 shows a performance of MCS7 with different singular value re-ordering schemes in CMD channels, according to an embodiment.
Figure 7:
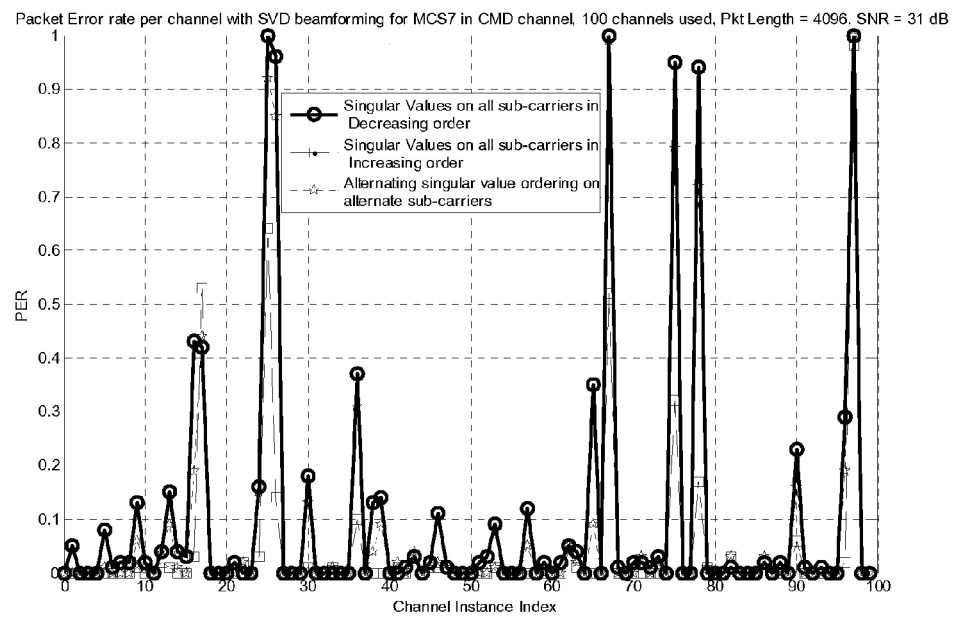
FIG. 7 shows packet errors statistics of MCS7 across 100 CMD channels with different re-ordering schemes, according to an embodiment.

FIG. 4 shows a performance of MCS0 with different singular value re-ordering schemes in CMD (channel model D provided by IEEE for modeling Wireless LAN propagation environment) channels. FIG. 5 shows packet errors statistics of MCS0 across 100 CMD channel realizations with different re-ordering schemes. FIG. 6 shows a performance of MCS7 with different singular value re-ordering schemes in CMD channels. FIG. 7 shows the packet errors statistics of MCS7 across 100 CMD channels with different re-ordering schemes.

The reordering schemes described above involve partitioning the subcarriers into sets and use a chosen reordering scheme for each set. Alternatively, the reordering scheme can be chosen more individually on a per subcarrier basis using additional criteria which examine the impact of other elements of the transmitter used to construct the signal such as the interleaver and the parser. Due to the interplay of these elements with the SNR of each subcarrier, certain susceptible portions of the signal fed to the decoder are more likely to cause decoding errors. Identifying such susceptible portions of the signal stream and then adjusting reordering schemes on specific subcarriers which can reduce the likelihood of those susceptible portions, and applying the beamforming matrix based on the adjusted reordering can lead to improved receiver performance.

An embodiment includes constructing de-interleaved and or stream de-parsed sequence of effective SNRs based on singular values (assuming the default decreasing order of singular values) per subcarrier and stream. This embodiment further includes finding all sequences of consecutive SNRs below an SNR threshold. Further, this embodiment includes rearranging singular value ordering on at least one of the subcarriers corresponding to the locations in the aforementioned sequences such that the number of such sequences with SNRs below the SNR threshold is reduced.

An embodiment includes cycling through a set of possible S′ permutations across adjacent subcarriers and repeat cycle to cover all subcarriers. Idea here is that by statistically evening out the distribution of high and low singular values across subcarriers, the de-interleaved signal will have lower likelihood of long sequence of low LLRs.

An embodiment includes letting the number of possible permutations of S be some number N. Divide the total number of subcarriers into N contiguous sets. For each set use one permutation of S. Again, as noted above, after de-interleaving, this approach may also result in a lower likelihood of long sequence of low LLRs. Note that low LLR is correlated with a low effective SNR. A simple 2×2 MIMO system can be used to illustrate. For an embodiment, the effective received vector on a chosen subcarrier is given by;

$$Y_{eff} = U^H Y = SX + U^H N$$

Since S is a diagonal matrix of singular values with positive and real values, $s_{11}$ and $s_{22}$ and U is a unitary matrix, the above decomposition provides two parallel channels, that is;

$$y_{eff,stream1} = s_{11} x_1 + n_1$$

$$y_{eff,stream2} = s_{22} x_2 + n_2$$

where, x1 and x2 are the transmitted data on stream 1 and stream 2 respectively, and n1 and n2 are the complex Gaussian noise terms each with variance $\sigma^2$.

Note that the effective SNRs on stream 1 and stream 2 are proportional to $|s_{11}|^2$ and $|s_{22}|^2$ respectively.

To show the relation between SNR and LLRs, a simple modulation and coding scheme can be considered, such as MCS0 that uses BPSK modulation. The Log-likelihood ratio for a bit on stream 1 and stream 2 (for the case where the noise is white and Complex Gaussian) can be shown to be;

$$LLR_{stream1} = (4/\sigma^2) \cdot \text{Re}\{y_{eff,stream1} * s_{11}\}$$
$$= (4/\sigma^2) \cdot (s_{11}^2 \cdot \text{Re}\{x_1\} + s_{11} \cdot \text{Re}\{n_1\})$$
$$LLR_{stream2} = (4/\sigma^2) \cdot \text{Re}\{y_{eff,stream2} * s_{22}\}$$
$$= (4/\sigma^2) \cdot (s_{22}^2 \cdot \text{Re}\{x_2\} + s_{22} \cdot \text{Re}\{n_2\})$$

Hence, it can be observed from the above relations, that the LLRs are closely related to the singular values $s_{11}$ and $s_{22}$ and hence the SNRs on each stream. Specifically, the SNRs are proportional to the square of the singular values. Additionally, the higher the singular value, the higher the confidence level or equivalently LLR since the transmitted symbol is effectively multiplied by the square of the singular value while the noise is only multiplied by the singular value. An embodiment includes adjusting reordering across subcarriers such that the maximum number of subcarriers across any stream less than a threshold is minimized.

Figure 8:
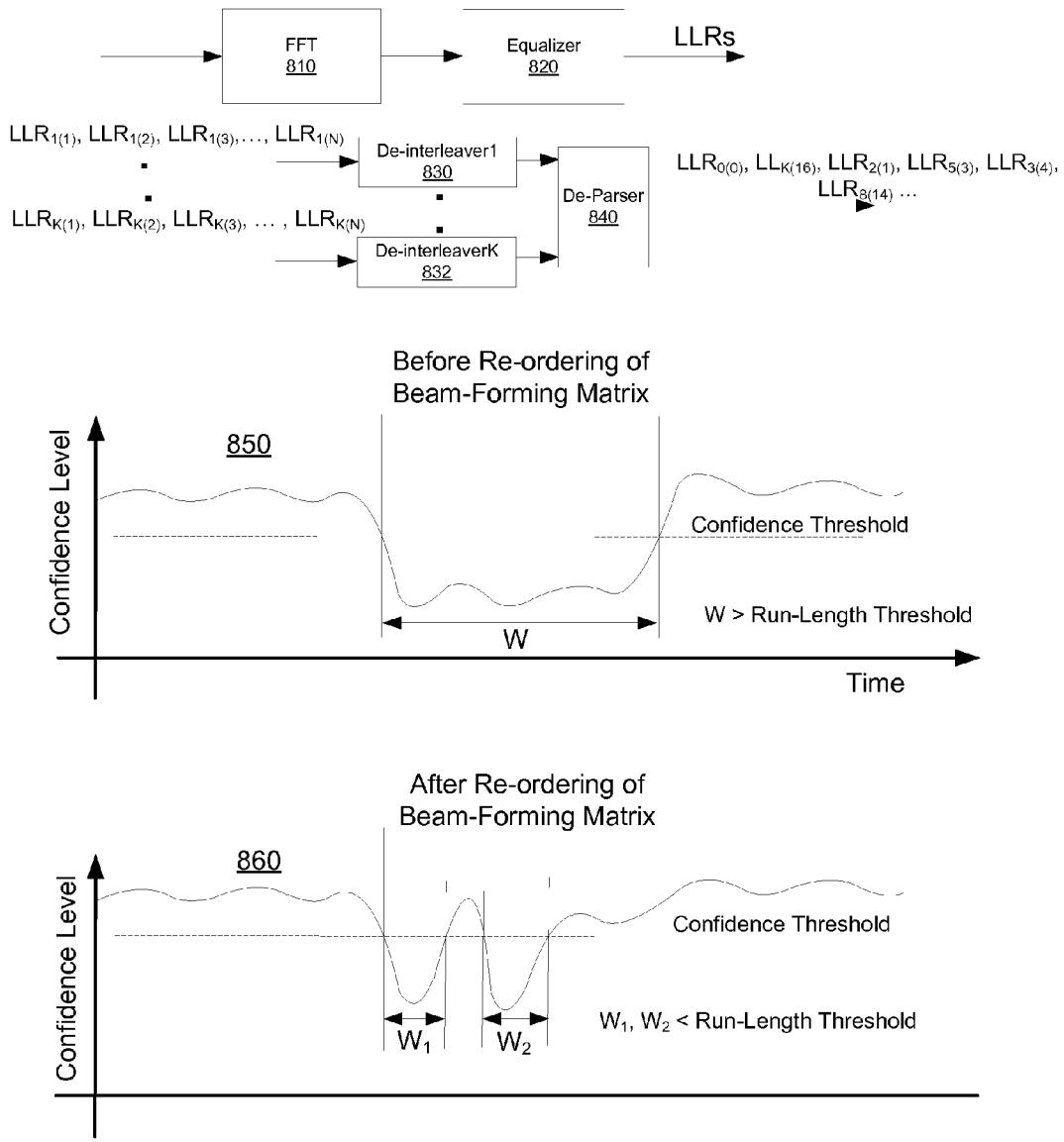
FIG. 8 shows electronic circuitry for generating LLRs (log-likelihood ratios), and graphs that depict the corresponding confidence levels with different schemes of reordering a beamforming matrix, according to an embodiment.

FIG. 8 shows electronic circuitry for generating LLRs, and graphs that depict the corresponding confidence levels before and after reordering a beamforming matrix, according to an embodiment. Confidence levels are computed based on knowledge of the SNR for a subcarrier along with the mapper used to map the bits to a constellation point by the transmitter. As shown, an FFT 810 receives a stream of bits of a received signal. The output of the FFT 810 is equalized by an equalizer 820. For the K spatial streams, K FFTs and K equalizers generate K streams of LLRs. The K streams of LLRs are then de-interleaved by K de-inter-leavers 830, 832. The outputs of the de-inter-leavers 830, 832 are received and de-parsed by a de-parser 840, generating a stream of LLRs. That is, a de-parsed, de-interleaved sequence of confidence levels is constructed based on singular values per subcarrier of the plurality spatial streams of the MIMO channel. In this example, a single stream of LLRs is shown after de-parsing since a single convolutional encoder is used. For the case where multiple convolutional encoders are used, the resulting number of stream(s) of LLRs will be equivalent to the number of convolutional encoders. Additionally, when the number of spatial streams is equal to the number of convolutional encoders and each encoder's output is mapped to a spatial stream (that is, 1 to 1 mapping between an encoder and a spatial stream), the parser essentially becomes a pass-through or is non-existent. In this case, the de-parser is not required.

A first plot 850 depicts confidence levels of the stream of LLRs over time after being de-interleaved. As shown, a portion of the plot falls below a confidence threshold. The width W of this portion is dependent on how many consecutive confidence levels fall below the confidence threshold. That is a contiguous sequence of confidence levels in the de-interleaved sequence are identified, wherein each of the confidence levels in the contiguous sequence is below the confidence threshold and number of confidence levels in the contiguous sequence exceeds a run-length threshold, wherein the run-length threshold is chosen based on properties of a convolutional code used by the transmitter. Further reordering of the columns of the initial beamforming matrix of at least one of the subcarriers reduces a number of confidence levels in contiguous sequences of the de-interleaved sequence that are below the confidence threshold to be below the run-length threshold as shown by the second plot 860. That is, the W1 and W2 have run-lengths less than the run-length threshold due to the re-ordering of the columns of the initial beamforming matrix.

Figure 9:
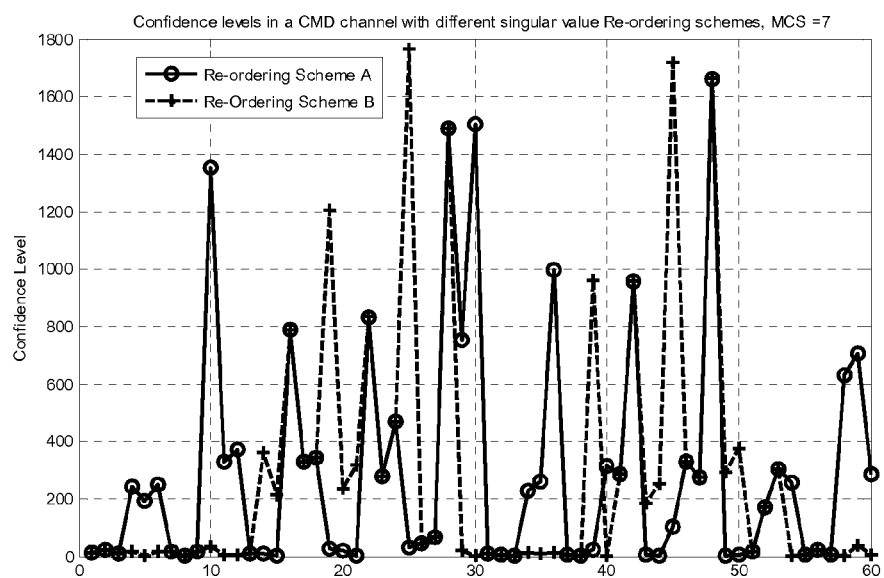
FIG. 9 shows a plot of confidence levels of LLRs over time after being de-interleaved and stream de-parsed with different reordering schemes, according to an embodiment.
Figure 10:
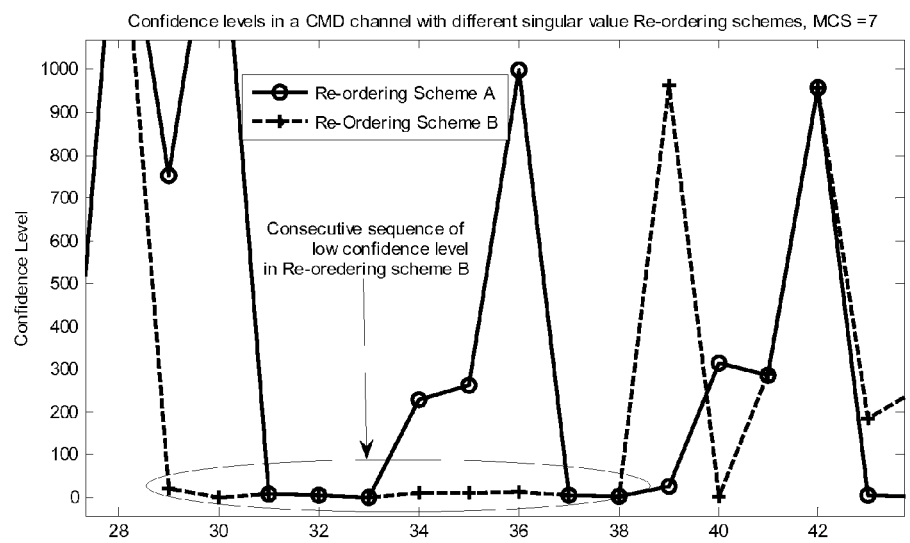
FIG. 10 shows a zoomed (enlarged) version of FIG. 9, according to an embodiment.

FIG. 9 depicts a plot of confidence levels of LLRs over time after being de-interleaved with different reordering schemes. FIG. 10 is a zoomed version of FIG. 9 and it can be observed that in reordering scheme B, the result is a sequence with consecutive low confidence level. Such a sequence of consecutive low confidence level could be detrimental in the decoding process, thereby causing packet failure.

Figure 11:
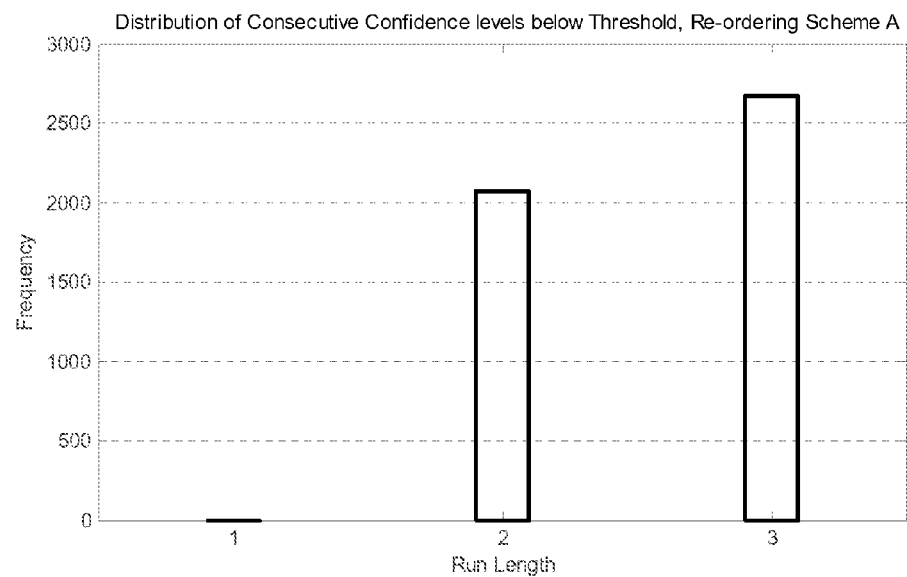
FIG. 11 shows a run-length (contiguous sequence with confidence level below a confidence threshold) distribution of consecutive confidence levels of the LLRs below the confidence threshold for a first re-ordering scheme A.
Figure 12:
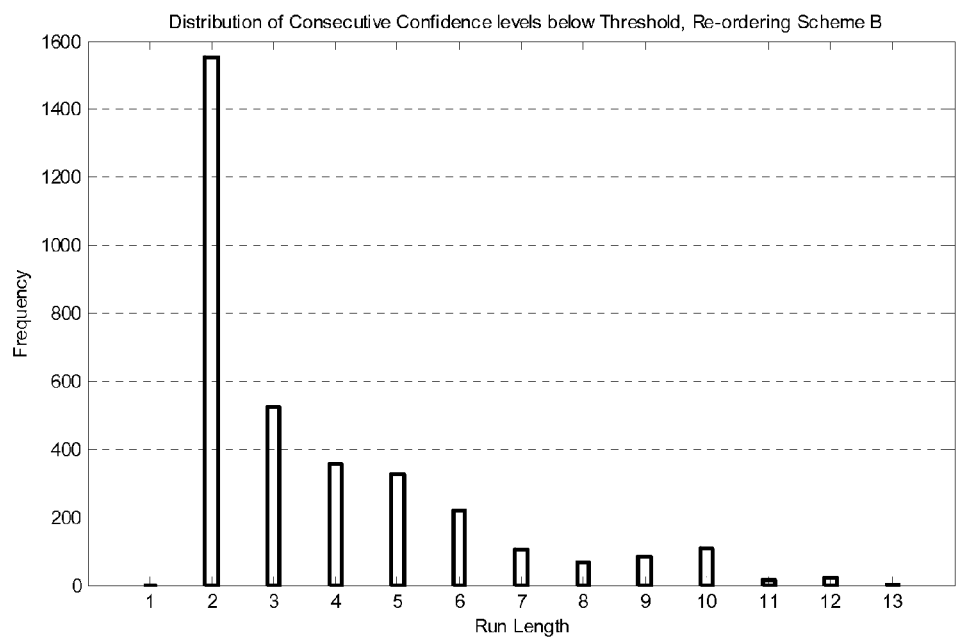
FIG. 12 shows a run-length (contiguous sequence with confidence level below a confidence threshold) distribution of consecutive confidence levels of the LLRs below the confidence threshold for a second re-ordering scheme B.

FIG. 11 and FIG. 12 depict the run-length (contiguous sequence with confidence level below a confidence threshold) distribution of consecutive confidence levels of the LLRs below the confidence threshold for a first re-ordering scheme A and second re-ordering scheme B. Note that in reordering scheme B, there are significant number of sub-sequences that have consecutive confidence levels below a confidence threshold. This can lead to higher packet error rates. For example, if a code can correct continuous burst of up to say, D=5 errors, then reordering scheme B is worse compared to scheme A since there are many bursts in the confidence level sequence that have run-lengths greater than D. Hence using reordering scheme A is better justified when compared to reordering scheme B.

Figure 13:
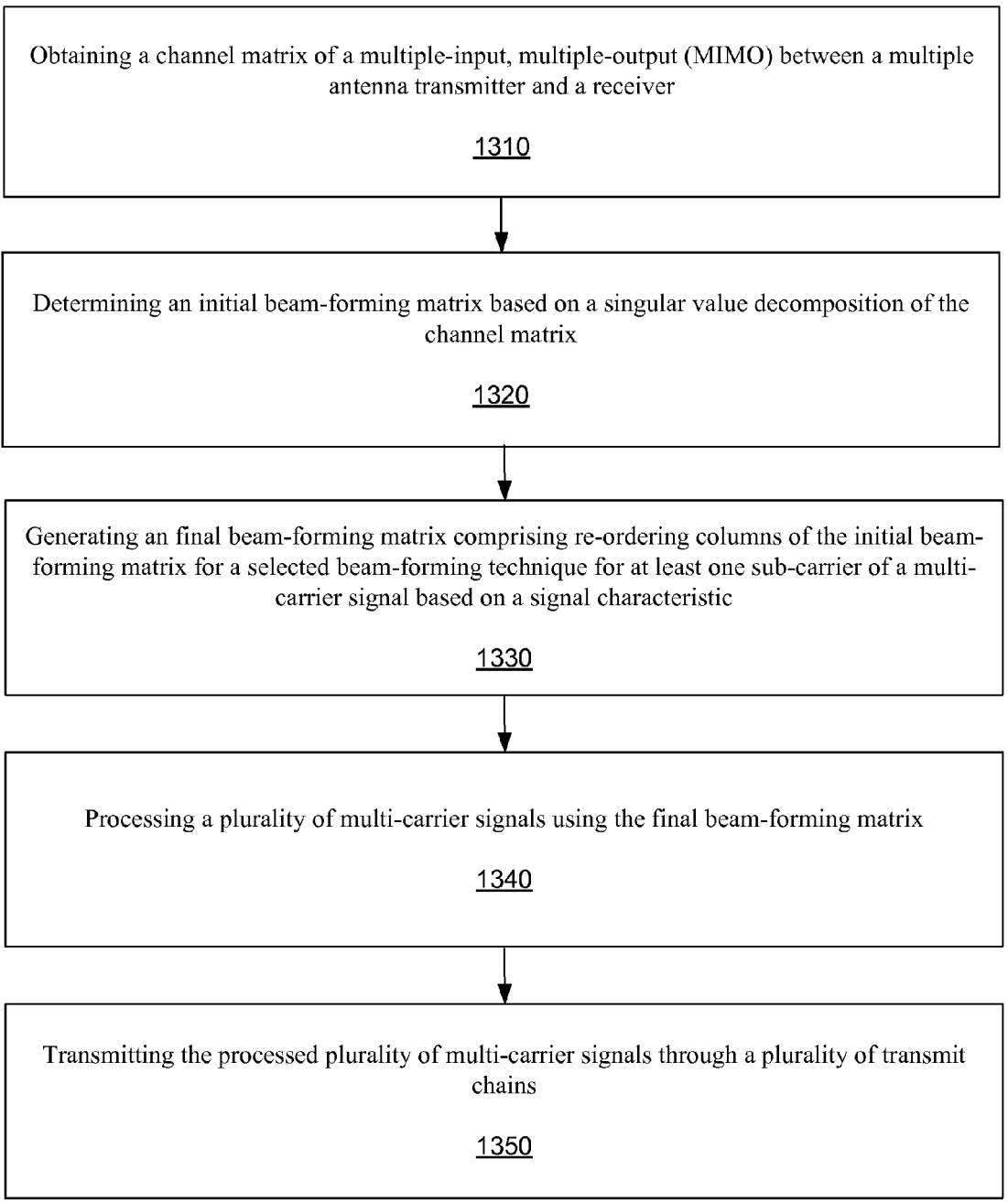
FIG. 13 is a flow chart that includes steps of a method of beamforming, according to an embodiment.

FIG. 13 is a flow chart that includes steps of a method of beamforming, according to an embodiment. A first step 1310 includes obtaining a channel matrix of a multiple-input, multiple-output (MIMO) between a multiple antenna transmitter and a receiver. A second step 1320 includes determining an initial beamforming matrix based on a singular value decomposition of the channel matrix. A third step 1330 includes generating an final beamforming matrix comprising re-ordering columns of the initial beamforming matrix for a selected beamforming technique for at least one sub-carrier of a multi-carrier signal based on a signal characteristic.

A fourth step 1340 includes processing a plurality of multi-carrier signals using the final beamforming matrix. A fifth step 1350 includes transmitting the processed plurality of multi-carrier signals through a plurality of transmit chains. It is to be understood that for an embodiment, the steps 1310, 1320, 1330, 1340 and 1350 can all be completed within a single transceiver. However, for other embodiments, the steps may be completed at multiple transceivers. For example, steps 1310, 1320, 1330 can be completed at a receiving transceiver, and steps 1340, 1350 can be completed at a transmitting transceiver. Alternatively, steps 1310, 1320 can be completed at a receiving transceiver and steps 1330, 1340, 1350 can be completed at a transmitting transceiver.

As described, for an embodiment, the signal characteristic includes a modulation and coding schemes. For an embodiment, the re-ordering of the columns of the initial beamforming matrix is performed using a current packet of the multi-carrier signals. For an embodiment, once the modulation and coding scheme is identified, a column re-ordering scheme is determined by accessing a look-up-table (LUT) based on the identified modulation and coding scheme.

For an embodiment, the re-ordering of the columns of the initial beamforming matrix is performed based on a current packet of the multicarrier signals. For at least some embodiments, the beamforming matrix is computed based on the current packet. However, the beamforming matrix cannot be applied until the next transmitted packet by the transmitting transceiver.

For an embodiment, the columns of the initial beamforming matrix are re-ordered upon changes of the signal characteristic. For an embodiment, the signal characteristic includes a data rate.

An embodiment further includes constructing de-interleaved sequences of confidence levels for each spatial stream of a plurality of spatial streams of the MIMO channel based on singular values per subcarrier of each spatial stream, wherein the confidence levels include functions of SNRs (signal to noise ratios), constructing a de-parsed sequence of confidence levels from the de-interleaved sequences, and identifying a contiguous sequence of confidence levels in the de-parsed sequence, wherein each of the confidence levels in the contiguous sequence is below a confidence threshold and number of confidence levels in the contiguous sequence exceeds a run-length threshold. The reordering of the columns of the initial beamforming matrix of at least one of the subcarriers reduces a number of confidence levels in contiguous sequences of the de-parsed sequence that are below the confidence threshold to be below the run-length threshold. For an embodiment, the run-length threshold is based on properties of a convolutional code used by the multiple chain transmitter.

An embodiment further includes constructing a plurality of K de-interleaved sequences of confidence levels based on singular values per subcarrier of a plurality spatial streams of the MIMO channel, wherein the confidence levels include functions of SNRs (signal to noise ratios), wherein each of the plurality of the K de-interleaved sequences corresponds to a one of K encoded data streams of a transmitter. That is, for an embodiment, the multi-chain transmitter includes N transmit chains and K encoders where source data is split into K data streams, passed through K encoders, and then "expanded" into N transmit streams. This embodiment further includes identifying a contiguous sequence of confidence levels in each of the plurality of de-interleaved sequences, wherein each of the confidence levels in the contiguous sequence is below a confidence threshold and number of confidence levels in the contiguous sequence exceeds a run-length threshold. The reordering of the columns of the initial beamforming matrix of at least one of the subcarriers reduces a number of confidence levels in contiguous sequences of the at least one of the plurality of de-interleaved sequences that are below the confidence threshold to be below the run-length threshold.

An embodiment further includes constructing a plurality of K sequences of confidence levels based on singular values per subcarrier of a plurality spatial streams of the MIMO channel, wherein the confidence levels include functions of SNRs (signal to noise ratios), wherein each of the plurality of the K sequences corresponds to a one of K encoded data streams of a transmitter. This embodiment further includes computing an average confidence level for each of the plurality of sequences, identifying the lowest average confidence level, wherein the reordering of the columns of the initial beamforming matrix of at least one of the subcarriers increases the lowest average confidence level. For this embodiment, de-interleaving is not necessary because the average confidence level is being computed. Reordering columns on a subset of subcarriers improves the average confidence level on the worst stream (and as a byproduct reduces the average confidence level on the other streams). Generally, the idea is to equalize or balance the average confidence levels across the multiple encoded streams. Using the de-interleaved sequence approach with checking for contiguous sequences against thresholds can be more beneficial than the average confidence level approach, but in some situations requires more knowledge of encoder and the inter-leaver, and may also require more latency.

An embodiment further includes constructing a de-interleaved sequence of effective SNRs based on singular values per subcarrier of all spatial streams of the MIMO channel, and identifying a contiguous sequence of effective SNRs in the de-interleaved sequence, wherein each of the effective SNRs in the contiguous sequence is below an SNR threshold and number of effective SNRs in the contiguous sequence exceeds a run-length threshold. The reordering of the columns of the initial beamforming matrix of at least one of the subcarriers reduces a number of effective SNRs in contiguous sequences of the de-interleaved sequence that are below the SNR threshold to be below the run-length threshold. For an embodiment, the run-length threshold is based on properties of a convolutional code used by the multiple chain transmitter.

An embodiment further includes cycling through a plurality of possible permutations for re-ordering columns of the initial beamforming matrix across adjacent subcarrier, and repeating the cycling to cover all subcarriers.

An embodiment further includes identifying a number of possible permutations of the re-ordering of columns to be a number N, dividing the total number of subcarriers into N sets, and re-ordering columns of the initial beamforming matrix according to a one of the N permutations for at least a subset of the N sets.

At least some embodiments further include adjusting the re-ordering of columns, wherein a maximum number of subcarriers across any spatial stream with a singular value less than a singular value threshold, is minimized. Based on knowledge of the code, the number of correctable errors by the decoder can be estimated. Additionally, based on knowledge of the modulation scheme and constellation mapper, a singular value threshold (SVT) can be obtained such that any subcarrier with singular value below the SVT is likely to yield at least one bit with sufficiently low confidence level which will require correction by the decoder. When the singular values of a large number of subcarriers on any spatial stream fall below the SVT, there is a high likelihood of uncorrectable errors by the decoder. Therefore, choosing a reordering scheme which minimizes or at least reduces the maximum number of subcarriers for any spatial stream with singular value below the SVT helps to improve performance of the receiver.

At least some embodiments further include selecting the re-ordering of the columns to reduce decoding errors at a receiver of the plurality of multi-carrier signals as compared to decoding errors at the receiver utilizing the initial beamforming matrix.

For least some embodiments, selecting a beamforming technique includes singular value decomposition (SVD), wherein the initial beamforming matrix includes at least one of Ascending Value SVD (AVSVD) that includes diagonal singular values in an increasing order, or Descending Value SVD (DVSVD) that includes diagonal singular values in an increasing order.

For least some embodiments, if the initial beamforming matrix includes AVSVD, then the final beamforming matrix includes DVSVD, and if the initial beamforming matrix includes DVSVD, then the final beamforming matrix includes AVSVD.

For least some embodiments, final beamforming matrix is determined at the receiver and transmitted back to the multiple antenna transmitter. For least some embodiments, final beamforming matrix is determined at the multiple antenna transmitter.

A semiconductor intellectual property core, such as a microprocessor core, or a portion thereof, fixed function circuitry, or configurable circuitry embodying the disclosure can be described in data stored on a machine readable medium. Such data can be in accordance with a Hardware Description Language (HDL), and may include Register Transfer Language (RTL) description data, for example. This descriptive data can be used to simulate, verify, and/or produce a specific implementation of the disclosure (e.g., an integrated circuit, or a combination of integrated circuit(s) and discrete components).

The disclosure explained example embodiments using block diagrams that, for example, show a flow of data through different functional blocks. To a person of ordinary skill in the relevant arts, the names given to these functional blocks also describe example structure for implementing those functions, without including unnecessary detail. These functional blocks can have varied implementations, including using fixed-function circuitry, partially configurable circuitry, special-purpose processors, such as digital signal processors, generally programmable processor cores, and combinations thereof. For example, some implementations may implement some of the depicted functional blocks using software configuring a processor, while others may use fixed-function circuitry. Since different implementations may use different physical hardware elements, the depiction of particular arrangements of functional blocks does not imply that implementations need to have separate structures implementing those functions. For example, a beam forming matrix multiplier can be implemented as a separate multiplier from processor 280, but such multiplier also could be implemented as a resource shared with other functional blocks, or a multiplier driven by decoded instructions from a processor (such as, processor 280).

This disclosure explains that a processor can perform certain aspects of methods according to the disclosure. Such processor can be a generally programmable processor, which can execute machine readable code according to an instruction set architecture. Such processor also can have more limited configurability, such as allowing configurability using supplied sets of parameters that modify execution of a set of sub-routines available from a non-volatile memory, for example. The processor also can include fixed-function circuitry, which can interoperate with programmable or configurable elements of the processor. When such a processor is configured to perform a function or action described in the disclosure, the processor effectively becomes circuitry for performing that function or action, even while the processor also can be circuitry for performing other functions or actions. As such, the term "circuitry" does not imply a single electrically connected set of circuits, and circuitry may be fixed-function, configurable, or programmable.

Although specific embodiments have been described and illustrated, the embodiments are not to be limited to the specific forms or arrangements of parts so described and illustrated. The described embodiments are to only be limited by the claims.

What is claimed:

1. A method of beamforming, comprising:
generating a beamforming matrix, comprising;
  obtaining a channel matrix of a multiple-input, multiple-output (MIMO) channel between a multiple antenna transmitter and a receiver;
  determining an initial beamforming matrix based on a singular value decomposition of the channel matrix; and
  generating, by a transceiver, a final beamforming matrix comprising re-ordering columns of the initial beamforming matrix for at least one sub-carrier of a multi-carrier signal based on a signal characteristic; wherein
  a selected initial beamforming technique includes singular value decomposition (SVD), wherein the initial beamforming matrix includes at least one of Ascending Value SVD (AVSVD) that includes diagonal singular values in an increasing order, or Descending Value SVD (DVSVD) that includes diagonal singular values in a decreasing order.

2. The method of claim 1, further comprising:
processing a plurality of multi-carrier signals using the final beamforming matrix; and
transmitting the processed plurality of multi-carrier signals through a plurality of transmit chains of the multiple antenna transmitter.

3. The method of claim 1, wherein the signal characteristic includes a modulation and coding scheme.

4. The method of claim 3, wherein once the modulation and coding scheme is identified, a column re-ordering scheme is determined by accessing a look-up-table (LUT) based on the identified modulation and coding scheme.

5. The method of claim 1, wherein the columns of the initial beamforming matrix are re-ordered upon changes of the signal characteristic.

6. The method of claim 1, wherein if the initial beamforming matrix comprises AVSVD, then the final beamforming matrix comprises DVSVD, and if the initial beamforming matrix comprises DVSVD, then the final beamforming matrix comprises AVSVD.

7. The method of claim 1, wherein the final beamforming matrix is determined at the receiver and transmitted back to the multiple antenna transmitter.

8. The method of claim 1, wherein the final beamforming matrix is generated at the multiple antenna transmitter.

9. A method of beamforming, comprising:
generating a beamforming matrix, comprising;
  obtaining a channel matrix of a multiple-input, multiple-output (MIMO) channel between a multiple antenna transmitter and a receiver;
  determining an initial beamforming matrix based on a singular value decomposition of the channel matrix; and
  generating, by a transceiver, a final beamforming matrix comprising re-ordering columns of the initial beamforming matrix for at least one sub-carrier of a multi-carrier signal based on a signal characteristic;
  constructing de-interleaved sequences of confidence levels for each spatial stream of a plurality spatial streams of the MIMO channel based on singular values per subcarrier of each spatial stream, wherein the confidence levels comprise functions of SNRs (signal to noise ratios);
  constructing a de-parsed sequence of the confidence levels from the de-interleaved sequences; and
  identifying a contiguous sequence of the confidence levels in the de-parsed sequence, wherein each of the confidence levels in the contiguous sequence is below a confidence threshold and a number of the confidence levels in the contiguous sequence exceeds a run-length threshold;
  wherein the reordering of the columns of the initial beamforming matrix of at least one of the subcarriers reduces the number of the confidence levels in contiguous sequences of the de-parsed sequence that are below the confidence threshold to be below the run-length threshold.

10. The method of claim 9, wherein the run-length threshold is based on properties of a convolutional code used by a plurality of transmit chains of the multiple antenna transmitter.

11. A method of beamforming, comprising:
generating a beamforming matrix, comprising;
obtaining a channel matrix of a multiple-input, multiple-output (MIMO) channel between a multiple antenna transmitter and a receiver;
determining an initial beamforming matrix based on a singular value decomposition of the channel matrix; and
generating, by a transceiver, a final beamforming matrix comprising re-ordering columns of the initial beamforming matrix for at least one sub-carrier of a multi-carrier signal based on a signal characteristic;
constructing a plurality of K de-interleaved sequences of confidence levels based on singular values per subcarrier of a plurality spatial streams of the MIMO channel, wherein the confidence levels comprise functions of SNRs (signal to noise ratios), wherein each of the plurality of the K de-interleaved sequences corresponds to a one of K encoded data streams of the multiple antenna transmitter; and
identifying a contiguous sequence of the confidence levels in at least one of the plurality of K de-interleaved sequences, wherein each of the confidence levels in the contiguous sequence is below a confidence threshold and a number of the confidence levels in the contiguous sequence exceeds a run-length threshold;
wherein the reordering of the columns of the initial beamforming matrix of at least one of the subcarriers reduces the number of the confidence levels in contiguous sequences of the at least one of the plurality of K de-interleaved sequences that are below the confidence threshold to be below the run-length threshold.

12. A method of beamforming, comprising:
generating a beamforming matrix, comprising;
obtaining a channel matrix of a multiple-input, multiple-output (MIMO) channel between a multiple antenna transmitter and a receiver;
determining an initial beamforming matrix based on a singular value decomposition of the channel matrix; and generating, by a transceiver, a final beamforming matrix comprising re-ordering columns of the initial beamforming matrix for at least one sub-carrier of a multi-carrier signal based on a signal characteristic;

constructing a plurality of K sequences of confidence levels based on singular values per subcarrier of a plurality spatial streams of the MIMO channel, wherein the confidence levels comprise functions of SNRs (signal to noise ratios), wherein each of the plurality of the K sequences corresponds to a one of K encoded data streams of the multiple antenna transmitter;

computing an average confidence level for each of the plurality of K sequences; and identifying a lowest average confidence level of the plurality of K sequences from the computed average confidence levels;

wherein the reordering of the columns of the initial beamforming matrix of at least one of the subcarriers increases the lowest average confidence level.

13. A method of beamforming, comprising:
generating a beamforming matrix, comprising;
obtaining a channel matrix of a multiple-input, multiple-output (MIMO) channel between a multiple antenna transmitter and a receiver;
determining an initial beamforming matrix based on a singular value decomposition of the channel matrix; and
generating, by a transceiver, a final beamforming matrix comprising re-ordering columns of the initial beamforming matrix for at least one sub-carrier of a multi-carrier signal based on a signal characteristic;
constructing a de-interleaved sequence of effective SNRs based on singular values per subcarrier of all spatial streams of the MIMO channel; and
identifying a contiguous sequence of effective SNRs in the de-interleaved sequence, wherein each of the effective SNRs in the contiguous sequence is below an SNR threshold and a number of the effective SNRs in the contiguous sequence exceeds a run-length threshold;
wherein the reordering of the columns of the initial beamforming matrix of at least one subcarrier reduces a number of effective SNRs in the contiguous sequences of the de-interleaved sequence that are below the SNR threshold to be below the run-length threshold.

14. The method of claim 13, wherein the run-length threshold is based on properties of a convolutional code used by the multiple chain transmitter.

15. A method of beamforming, comprising:
generating a beamforming matrix, comprising;
obtaining a channel matrix of a multiple-input, multiple-output (MIMO) channel between a multiple antenna transmitter and a receiver;
determining an initial beamforming matrix based on a singular value decomposition of the channel matrix; and
generating, by a transceiver, a final beamforming matrix comprising re-ordering columns of the initial beamforming matrix for at least one sub-carrier of a multi-carrier signal based on a signal characteristic;
cycling through a plurality of possible permutations for re-ordering columns of the initial beamforming matrix across adjacent subcarriers, and repeating the cycling to cover all subcarriers.

16. A method of beamforming, comprising:
generating a beamforming matrix, comprising;
obtaining a channel matrix of a multiple-input, multiple-output (MIMO) channel between a multiple antenna transmitter and a receiver;
determining an initial beamforming matrix based on a singular value decomposition of the channel matrix; and
generating, by a transceiver, a final beamforming matrix comprising re-ordering columns of the initial beamforming matrix for at least one sub-carrier of a multi-carrier signal based on a signal characteristic;
identifying a number of possible permutations of the re-ordering of columns to be a number N;
dividing a total number of subcarriers of the multicarrier signal into N sets; and
re-ordering columns of the initial beamforming matrix according to a one of the N permutations for at least a subset of the N sets.

17. A method of beamforming, comprising:
generating a beamforming matrix, comprising;
obtaining a channel matrix of a multiple-input, multiple-output (MIMO) channel between a multiple antenna transmitter and a receiver;
determining an initial beamforming matrix based on a singular value decomposition of the channel matrix; and
generating, by a transceiver, a final beamforming matrix comprising re-ordering columns of the initial beamforming matrix for at least one sub-carrier of a multi-carrier signal based on a signal characteristic;
adjusting the re-ordering of columns, wherein the adjusting ensures that a maximum number of subcarriers across any spatial stream with a singular value less than a threshold is reduced.

18. A method of beamforming, comprising:
generating a beamforming matrix, comprising;
obtaining a channel matrix of a multiple-input, multiple-output (MIMO) channel between a multiple antenna transmitter and a receiver;
determining an initial beamforming matrix based on a singular value decomposition of the channel matrix; and
generating, by a transceiver, a final beamforming matrix comprising re-ordering columns of the initial beamforming matrix for at least one sub-carrier of a multi-carrier signal based on a signal characteristic;
selecting the re-ordering of the columns to reduce decoding errors at a receiver of the plurality of multi-carrier signals as compared to decoding errors at the receiver utilizing the initial beamforming matrix.

19. An apparatus, comprising:
a plurality of receive chains;
a processor, wherein the processor is operative to:
obtain a channel matrix of a multiple-input, multiple-output (MIMO) channel between a multiple antenna transmitter and the plurality of receive chains;
determine an initial beamforming matrix based on a singular value decomposition of the channel matrix; and
generate a final beamforming matrix comprising re-ordering columns of the initial beamforming matrix for a selected beamforming technique for at least one sub-carrier of a multi-carrier signal based on a signal characteristic; wherein
a selected initial beamforming technique includes singular value decomposition (SVD), wherein the initial beamforming matrix includes at least one of Ascending Value SVD (AVSVD) that includes diagonal singular values in an increasing order, or Descending Value SVD (DVSVD) that includes diagonal singular values in a decreasing order.

20. The apparatus of claim 19, wherein the processor is operative to:
  facilitate processing a plurality of multi-carrier signals using the final beamforming matrix; and wherein the apparatus is operative to
  transmit the processed plurality of multi-carrier signals through a plurality of antennas of the multiple antenna transmitter.

21. The apparatus of claim 19, wherein the apparatus is operative to provide the final beamforming matrix to a second transceiver that includes the plurality of antennas of the multiple antenna transmitter.

22. An apparatus, comprising:
  a plurality of receive chains;
  a processor, wherein the processor is operative to:
    obtain a channel matrix of a multiple-input, multiple-output (MIMO) channel between a multiple antenna transmitter and the plurality of receive chains;
    determine an initial beamforming matrix based on a singular value decomposition of the channel matrix;
    generate a final beamforming matrix comprising re-ordering columns of the initial beamforming matrix for a selected beamforming technique for at least one sub-carrier of a multi-carrier signal based on a signal characteristic;
    construct de-interleaved sequences of confidence levels for each spatial stream of a plurality spatial streams of the MIMO channel based on singular values per sub-carrier of each spatial stream, wherein the confidence levels comprise functions of SNRs (signal to noise ratios);
    construct a de-parsed sequence of the confidence levels from the de-interleaved sequences; and
    identify a contiguous sequence of the confidence levels in the de-parsed sequence, wherein each of the confidence levels in the contiguous sequence is below a confidence threshold and number of the confidence levels in the contiguous sequence exceeds a run-length threshold;
    wherein the reordering of the columns of the initial beamforming matrix of at least one of the subcarriers reduces a number of the confidence levels in contiguous sequences of the de-parsed sequence that are below the confidence threshold to be below the run-length threshold.

23. The apparatus of claim 22, wherein the run-length threshold is based on properties of a convolutional code used by a plurality of transmit chains of the multiple antenna transmitter.

24. An apparatus, comprising:
  a plurality of receive chains;
  a processor, wherein the processor is operative to:
    obtain a channel matrix of a multiple-input, multiple-output (MIMO) channel between a multiple antenna transmitter and the plurality of receive chains;
    determine an initial beamforming matrix based on a singular value decomposition of the channel matrix;
    generate a final beamforming matrix comprising re-ordering columns of the initial beamforming matrix for a selected beamforming technique for at least one sub-carrier of a multi-carrier signal based on a signal characteristic;
    construct a plurality of K de-interleaved sequences of confidence levels based on singular values per sub-carrier of a plurality spatial streams of the MIMO channel, wherein the confidence levels comprise functions of SNRs (signal to noise ratios), wherein each of the plurality of the K de-interleaved sequences corresponds to a one of K encoded data streams of the multiple antenna transmitter; and
    identify a contiguous sequence of the confidence levels in at least one of the plurality of K de-interleaved sequences, wherein each of the confidence levels in the contiguous sequence is below a confidence threshold and number of the confidence levels in the contiguous sequence exceeds a run-length threshold;
    wherein the reordering of the columns of the initial beamforming matrix of at least one of the subcarriers reduces a number of the confidence levels in contiguous sequences of the at least one of the plurality of K de-interleaved sequences that are below the confidence threshold to be below the run-length threshold.

25. An apparatus, comprising:
  a plurality of receive chains;
  a processor, wherein the processor is operative to:
    obtain a channel matrix of a multiple-input, multiple-output (MIMO) channel between a multiple antenna transmitter and the plurality of receive chains;
    determine an initial beamforming matrix based on a singular value decomposition of the channel matrix;
    generate a final beamforming matrix comprising re-ordering columns of the initial beamforming matrix for a selected beamforming technique for at least one sub-carrier of a multi-carrier signal based on a signal characteristic;
    construct a plurality of K sequences of confidence levels based on singular values per subcarrier of a plurality spatial streams of the MIMO channel, wherein the confidence levels comprise functions of SNRs (signal to noise ratios), wherein each of the plurality of the K sequences corresponds to a one of K encoded data streams of the multiple antenna transmitter;
    compute an average confidence level for each of the plurality of K sequences; and
    identify a lowest average confidence level of the plurality from the computed average confidence levels;
    wherein the reordering of the columns of the initial beamforming matrix of at least one of the subcarriers increases the lowest average confidence level.

26. An apparatus, comprising:
  a plurality of receive chains;
  a processor, wherein the processor is operative to:
    obtain a channel matrix of a multiple-input, multiple-output (MIMO) channel between a multiple antenna transmitter and the plurality of receive chains;
    determine an initial beamforming matrix based on a singular value decomposition of the channel matrix;
    generate a final beamforming matrix comprising re-ordering columns of the initial beamforming matrix for a selected beamforming technique for at least one sub-carrier of a multi-carrier signal based on a signal characteristic;
    construct a de-interleaved sequence of effective SNRs based on singular values per subcarrier of all spatial streams of the MIMO channel; and
    identify a contiguous sequence of effective SNRs in the de-interleaved sequence, wherein each of the effective SNRs in the contiguous sequence is below an SNR threshold and a number of effective SNRs in the contiguous sequence exceeds a run-length threshold;
    wherein the reordering of the columns of the initial beamforming matrix of at least one subcarrier reduces a number of effective SNRs in contiguous sequences of the de-interleaved sequence that are below the SNR threshold to be below the run-length threshold.

27. The apparatus of claim 26, wherein the run-length threshold is based on properties of a convolutional code used by the multiple chain transmitter.

28. An apparatus, comprising:
a plurality of receive chains;
a processor, wherein the processor is operative to:
obtain a channel matrix of a multiple-input, multiple-output (MIMO) channel between a multiple antenna transmitter and the plurality of receive chains;
determine an initial beamforming matrix based on a singular value decomposition of the channel matrix;
generate a final beamforming matrix comprising re-ordering columns of the initial beamforming matrix for a selected beamforming technique for at least one sub-carrier of a multi-carrier signal based on a signal characteristic;
cycle through a plurality of possible permutations for re-ordering columns of the initial beamforming matrix across adjacent subcarriers, and repeating the cycling to cover all subcarriers.

29. An apparatus, comprising:
a plurality of receive chains;
a processor, wherein the processor is operative to:
obtain a channel matrix of a multiple-input, multiple-output (MIMO) channel between a multiple antenna transmitter and the plurality of receive chains;
determine an initial beamforming matrix based on a singular value decomposition of the channel matrix;
generate a final beamforming matrix comprising re-ordering columns of the initial beamforming matrix for a selected beamforming technique for at least one sub-carrier of a multi-carrier signal based on a signal characteristic;
identify a number of possible permutations of the re-ordering of columns to be a number N;
divide a total number of subcarriers of the multicarrier signal into N sets; and
re-order columns of the initial beamforming matrix according to a one of the N permutations for at least a subset of the N sets.

30. An apparatus, comprising:
a plurality of receive chains;
a processor, wherein the processor is operative to:
obtain a channel matrix of a multiple-input, multiple-output (MIMO) channel between a multiple antenna transmitter and the plurality of receive chains;
determine an initial beamforming matrix based on a singular value decomposition of the channel matrix;
generate a final beamforming matrix comprising re-ordering columns of the initial beamforming matrix for a selected beamforming technique for at least one sub-carrier of a multi-carrier signal based on a signal characteristic;
adjust the re-ordering of columns, wherein the adjustment ensures that a maximum number of subcarriers across any spatial stream with a singular value less than a threshold, is minimized.

31. An apparatus, comprising:
a plurality of receive chains;
a processor, wherein the processor is operative to:
obtain a channel matrix of a multiple-input, multiple-output (MIMO) channel between a multiple antenna transmitter and the plurality of receive chains;
determine an initial beamforming matrix based on a singular value decomposition of the channel matrix;
generate a final beamforming matrix comprising re-ordering columns of the initial beamforming matrix for a selected beamforming technique for at least one sub-carrier of a multi-carrier signal based on a signal characteristic;
select the re-ordering of the columns to reduce decoding errors at a receiver of the plurality of multi-carrier signals as compared to decoding errors at the receiver utilizing the initial beamforming matrix.

* * * * *